(12) United States Patent
LeFlohic

(10) Patent No.: US 6,637,950 B2
(45) Date of Patent: Oct. 28, 2003

(54) HYBRID OPTICAL COUPLING COMPONENT

(75) Inventor: Marc LeFlohic, Saint Quay Perros (FR)

(73) Assignee: Keopsys SA, Lannion (FR)

( * ) Notice: Subject to any disclaimer, the term of this patent is extended or adjusted under 35 U.S.C. 154(b) by 0 days.

(21) Appl. No.: 10/175,697

(22) Filed: Jun. 20, 2002

(65) Prior Publication Data

US 2002/0186937 A1 Dec. 12, 2002

Related U.S. Application Data

(63) Continuation of application No. PCT/FR00/03675, filed on Dec. 22, 2000.

(30) Foreign Application Priority Data

Dec. 23, 1999 (FR) .............................................. 99 16414

(51) Int. Cl.[7] .................................................. G02B 6/36
(52) U.S. Cl. .............................. 385/94; 385/92; 385/88; 385/39; 385/44
(58) Field of Search ............................. 385/14, 88, 89, 385/92, 93, 94, 139, 39, 44

(56) References Cited

U.S. PATENT DOCUMENTS

| | | | | |
|---|---|---|---|---|
| 4,296,988 A | * | 10/1981 | Warner | 439/398 |
| 4,699,456 A | * | 10/1987 | Mackenzie | 385/94 |
| 5,692,084 A | * | 11/1997 | Roff | 385/88 |
| 5,854,865 A | | 12/1998 | Goldberg | 385/31 |
| 5,919,383 A | | 7/1999 | Beguin et al. | 219/209 |
| 5,970,194 A | * | 10/1999 | Dunn et al. | 385/95 |
| 6,161,965 A | * | 12/2000 | Honmou | 385/94 |
| 6,367,988 B1 | * | 4/2002 | Auracher et al. | 385/88 |

FOREIGN PATENT DOCUMENTS

| | | | |
|---|---|---|---|
| DE | 44 02 166 | 11/1994 | ............. 385/94 X |
| EP | 0 100 086 | 2/1984 | ............. 385/94 X |
| EP | 0 917 263 | 5/1999 | ............. 385/94 X |

OTHER PUBLICATIONS

Ripin, D.J. et al. "High Efficiency Side–Coupling of Light into Optical Fibres Using Imbedded V–Grooves", Electronics Letters, GB, IEE Stevenage, vol. 31, No. 25, Dec. 7, 1995, pp. 2204–2205.

* cited by examiner

*Primary Examiner*—Brian Healy
(74) *Attorney, Agent, or Firm*—Piper Rudnick LLP

(57) ABSTRACT

An optical coupling component including at least one double sheath optical fiber for transverse optical coupling with a semiconductor diode, wherein the diode is a multimode semiconductor diode and the optical fiber and the diode are integrated in a hermetic housing to form a hybrid component also including a metal platen supporting the diode.

13 Claims, 2 Drawing Sheets

HYBRID OPTICAL COUPLING COMPONENT

RELATED APPLICATION

This is a continuation of International Application No. PCT/FR00/03675, with an international filing date of Dec. 22, 2000, which is based on French Patent Application No. FR 99/16414, filed Dec. 23, 1999.

FIELD OF THE INVENTION

This invention concerns a hybrid optical coupling component.

BACKGROUND

Known in the state of the art are optical coupling devices for pumping optical fibers constituted by a support to receive an optical fiber having a notch and an electroluminescent diode illuminating this notch. A coupling device of this type is described in U.S. Pat. No. 5,854,865 which concerns the coupling of a fiber for optical pumping.

EP 812039 describes a fiber light source with multimode fiber coupler.

It would accordingly be advantageous to provide a component presenting improvements in relation to the devices of the prior art for optical amplification or laser cavity pumping applications.

SUMMARY OF THE INVENTION

This invention relates to an optical coupling component including at least one double sheath optical fiber for transverse optical coupling with a semiconductor diode, wherein the diode is a multimode semiconductor diode and the optical fiber and the diode are integrated in a hermetic housing to form a hybrid component also including a metal platen supporting the diode.

BRIEF DESCRIPTION OF THE DRAWINGS

Better understanding of the invention will be obtained from the description below with reference to a nonlimitative example referring to the attached drawings in which.

DETAILED DESCRIPTION

Figure 1:
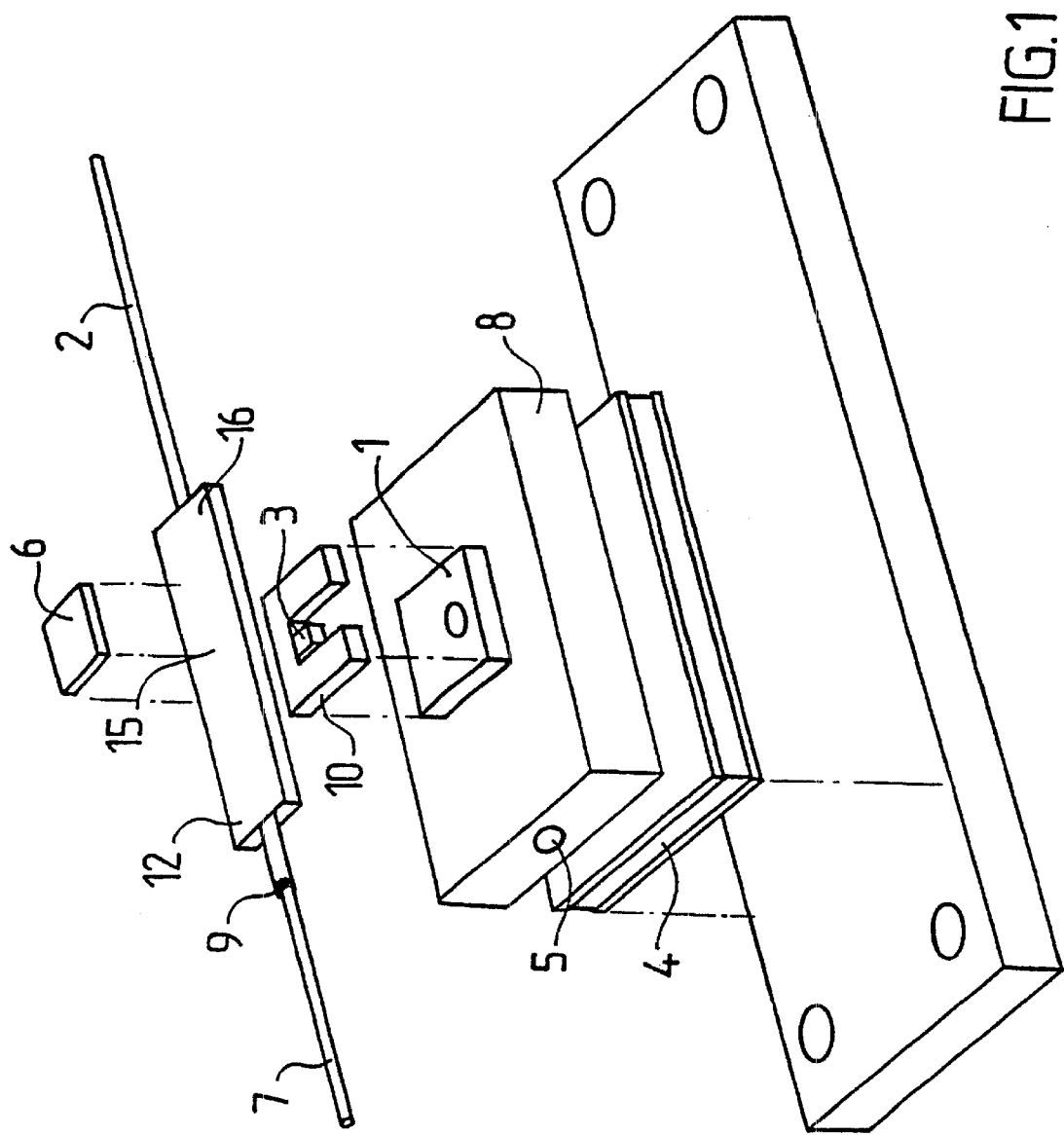
FIG. 1 represents an exploded view of an optical coupling component according to the invention.
Figure 2:
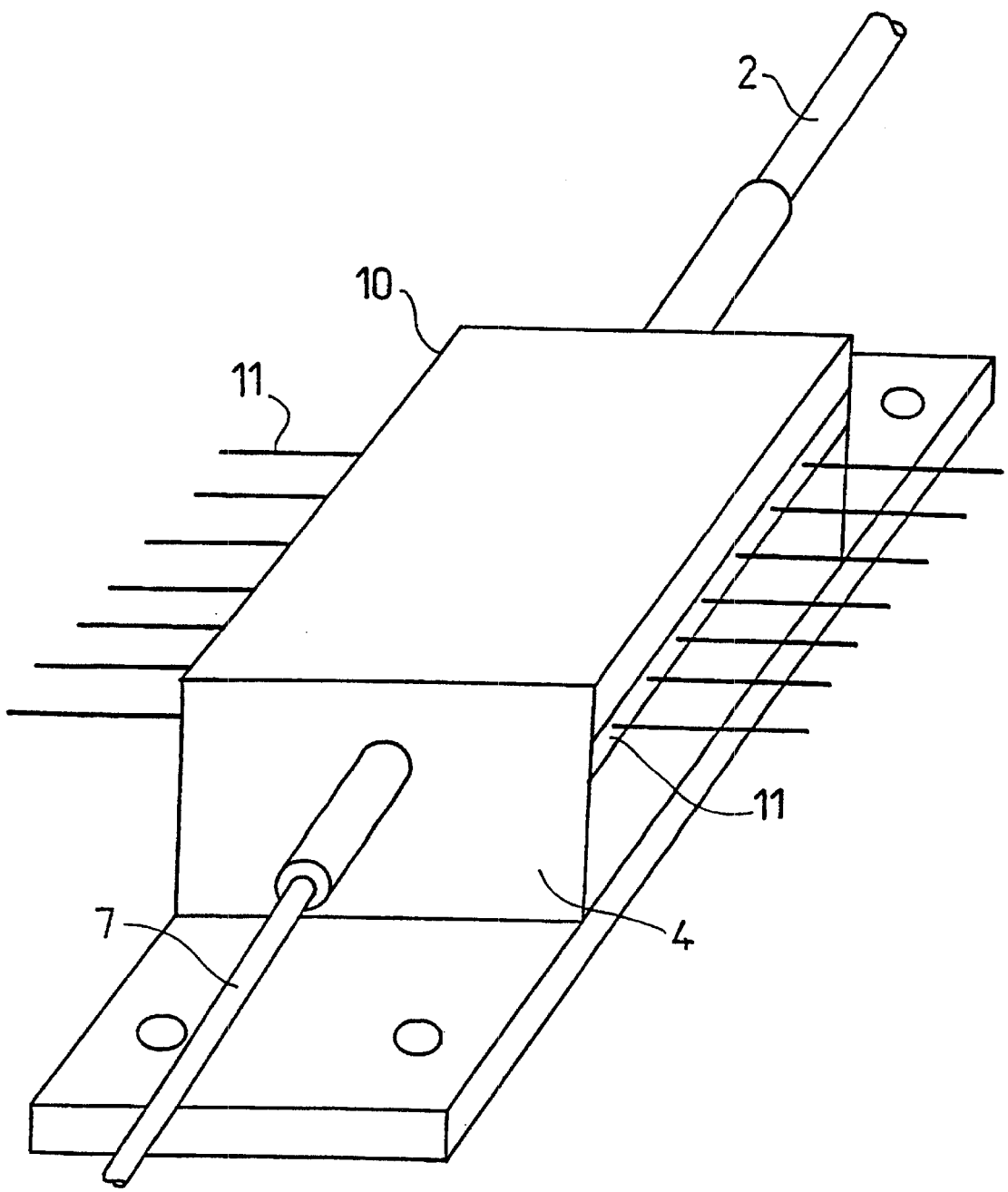
FIG. 2 represents an exterior view of an optical coupling device according to the invention.

This invention concerns a hybrid optical coupling component.

The invention in its most general sense pertains to a hybrid multiplexer optical coupling component constituted by a metal platen capable of receiving at least one optical fiber having one or more notches for transverse optical coupling with an electroluminescent semiconductor diode for optical fiber pumping, characterized in that at least one of the optical fibers is a double sheath optical fiber and in that the diode is a multimode semiconductor diode forming on the notch a light spot whose section is smaller than the projection of the section in a plane perpendicular to the optical axis of the diode.

The metal platen is advantageously constituted of a copper support capable of receiving the multimode diode, the copper support being thermally coupled to a Peltier effect element.

According to another advantageous mode of implementation, the notch has a reflective coating to increase the reflection of the pump light on the notch.

According to a first variant, the diode is affixed on the copper support with a low-temperature weld.

According to a second variant, the diode is affixed on the copper support by a mechanical connector on an indium foil.

According to a preferred mode of implementation, the component furthermore comprises a combination of two lenses crossed at 90° to limit the divergence of the diode in the planes parallel and perpendicular to the semiconductor junction and assure the collimation of the light beam produced by the multimode diode on the notch of the optical fiber.

It moreover advantageously comprises a glass plate or a birefringent plate for maintaining the double sheath fiber at the level of the notch.

According to a variant, the plate is glued on a support of low conductivity. The plate is advantageously covered by a metal film on its sides to allow welding onto the fiber support.

According to one particular application, the hybrid component according to the invention comprises a double sheath fiber for transport of the signal and the pumping light for implementation of the optical pumping of a laser cavity.

According to another application, the hybrid component according to the invention comprises a monomode optical fiber for transport of the signal and a double sheath fiber for transport of the signal and the pumping light, for the implementation of an optical amplification.

Referring now to the drawings, the multiplexer module described as a nonlimitative example comprises:

- a high-power multimode semiconductor diode (1),
- one or more double sheath fibers (2) with one or more coupling notches,
- a coupling lens (3),
- a half-wave plate (12),
- a Peltier element (4),
- a temperature sensor (5),
- a photodiode (6).

These components are integrated in a hermetic housing (10) comprising an electric connector (11) and for the optical amplification applications: a monomode optical fiber (7) transporting the signal and the pump;

for the laser cavity pumping applications: a double sheath fiber transporting the signal and the pump.

The laser diode (1) is mounted on a copper support (8) enabling evacuation of heat to the Peltier element (4) on which it is affixed. The diode (1) can be welded with a low-temperature weld or screwed on an indium foil.

The optical fiber (7) is welded on the copper support (8) by a metal strip (9).

The lens (3) is affixed, preferably with glue, on a glass support treated to be antireflective at the wavelength of the pump. The glass plate can be replaced by a half-wave plate whose function is to provide a mechanical support and orientation of the polarization of the pump diode to maximize the coupling. The glue used has an adequate index to limit Fresnel reflections.

The double sheath fiber (2) a notch (15) implemented by mechanical machining. A metal knife covered by a diamond paste is driven in a translational movement perpendicular to the fiber. Control of the depth of the notch is performed by position sensors.

The glass plate (16) or the birefringent plate maintaining the double sheath fiber (2) is glued on a metal support of low thermal conductivity. According to another implementation, it can be covered by a metal film on the ends to be welded to the fiber support. The geometry of this metal support is designed to create thermal bridges to enable welding on the copper block of the diode. The lens support has an opening at the level of the notch so that it can be visualized during the operation of coupling the diode in the fiber.

The lens is a combination of two lenses crossed at 90° to be able to limit the divergence of the diode in the planes parallel and perpendicular to the semiconductor junction. It can also image the emitting surface of the diode on the notch. It is glued or welded on a metal support of low thermal conductivity. The geometry of the support is designed to enable welding the diode on the copper block.

In the absence of the lens, alignment of the diode with the fiber can be implemented passively by means of a binocular microscope. With a lens, it is possible to optimize the coupling ratio of the pump in the double sheath fiber by aligning the lens and the fiber on the diode by means of a detector monitoring the pump coupled in the fiber or the signal generated by the pump in the case of a double sheath fiber doped with rare earth ions or luminescent doping agents. For this, the lens is positioned in relation to the diode by visualizing the close field and/or the distant field. The fiber is then placed against the lens and reference positioning of the notch is performed by observing the fiber pump light. When the notch reflects the fiber pump light, the pump light transmitted via the fiber is strongly attenuated and the double sheath fiber guides partially the light from the pump. Optimization of the coupling is performed by successive adjustments of the positions of the fiber and the lens.

Once optimization has been attained, the lens support is welded with a low-temperature weld on the brackets affixed on the copper block of the diode. It can also be glued with low-contraction epoxy adhesive.

The invention is described above as an example of implementation.

What is claimed is:

1. An optical coupling component comprising: at least one double sheath optical fiber transversely optically coupled with a semiconductor diode, wherein the diode is a multi-mode semiconductor diode and the optical fiber and the diode are integrated in a hermetic housing to form a hybrid component also comprising a metal platen supporting said diode.

2. The optical coupling component according to claim 1, wherein the double sheath optical fiber has one or more notches.

3. An optical coupling component comprising: at least one double sheath optical fiber for transverse optical coupling with a semiconductor diode, wherein the diode is a multi-mode semiconductor diode and the optical fiber and the diode are integrated in a hermetic housing to form a hybrid component also comprising a metal platen supporting said diode, wherein the double sheath optical fiber has one or more notches and the transverse optical coupling with a semiconductor forms on the notch a light spot the size of a section of which is smaller than the size of a projection of a section on a plane perpendicular to an optical axis of the diode.

4. An optical coupling component comprising: at least one double sheath optical fiber for transverse optical coupling with a semiconductor diode, wherein the diode is a multi-mode semiconductor diode and the optical fiber and the diode are integrated in a hermetic housing to form a hybrid component also comprising a metal platen supporting said diode, wherein the hybrid component further comprises a metal platen supporting said diode.

5. An optical coupling component comprising: at least one double sheath optical fiber for transverse optical coupling with a semiconductor diode, wherein the diode is a multi-mode semiconductor diode and the optical fiber and the diode are integrated in a hermetic housing to form a hybrid component also comprising a metal platen supporting said diode, wherein the metal platen comprises a copper support capable of receiving the multimode diode, the copper support being thermally coupled to a Peltier effect element.

6. The optical coupling component according to claim 5, wherein the diode is affixed on the copper support with a low-temperature weld.

7. The optical coupling component according to claim 5, wherein the diode is affixed on the copper support by a mechanical connector on an indium foil.

8. An optical coupling component comprising: at least one double sheath optical fiber for transverse optical coupling with a semiconductor diode, wherein the diode is a multi-mode semiconductor diode and the optical fiber and the diode are integrated in a hermetic housing to form a hybrid component also comprising a metal platen supporting said diode, and a combination of two lenses crossed at 90° C. to limit divergence of the diode in planes parallel and perpendicular to the semiconductor junction and assure the collimation of a light beam produced by the multimode diode on the notch of the optical fiber, wherein the double sheath optical fiber has one or more notches.

9. An optical coupling component comprising: at least one double sheath optical fiber for transverse optical coupling with a semiconductor diode, wherein the diode is a multi-mode semiconductor diode and the optical fiber and the diode are integrated in a hermetic housing to form a hybrid component also comprising a metal platen supporting said diode, and a glass plate or a birefringent plate for maintaining the double sheath fiber at the level of the notch, wherein the double sheath optical fiber has one or more notches.

10. The optical coupling component according to claim 9, wherein the plate is glued on a support of low conductivity.

11. The optical coupling component according to claim 9, wherein the plate is covered by a metal film on its sides to allow welding onto the fiber support.

12. An optical coupling component comprising: at least one double sheath optical fiber for transverse optical coupling with a semiconductor diode, wherein the diode is a multimode semiconductor diode and the optical fiber and the diode are integrated in a hermetic housing to form a hybrid component also comprising a metal platen supporting said diode, and a double sheath fiber for transporting a signal and pumping light to implement optical pumping of a laser cavity.

13. An optical coupling component comprising: at least one double sheath optical fiber for transverse optical coupling with a semiconductor diode, wherein the diode is a multimode semiconductor diode and the optical fiber and the diode are integrated in a hermetic housing to form a hybrid component also comprising a metal platen supporting said diode, and a monomode optical fiber for transporting a signal and a double sheath fiber for transporting the signal and pumping light to implement an optical amplification.

* * * * *